US008525715B2

(12) United States Patent
Ogawa et al.

(10) Patent No.: US 8,525,715 B2
(45) Date of Patent: Sep. 3, 2013

(54) A/D CONVERSION APPARATUS AND DC-DC CONVERSION APPARATUS

(75) Inventors: Taichi Ogawa, Tokyo (JP); Masanori Furuta, Odawara (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/525,956

(22) Filed: Jun. 18, 2012

(65) Prior Publication Data
US 2013/0049713 A1 Feb. 28, 2013

(30) Foreign Application Priority Data

Aug. 26, 2011 (JP) ................................. 2011-185216

(51) Int. Cl.
*H03M 1/06* (2006.01)
(52) U.S. Cl.
USPC .......................................... 341/118; 341/155
(58) Field of Classification Search
USPC ..................... 341/118, 155, 156, 117; 330/9, 330/259; 324/234
See application file for complete search history.

(56) References Cited

U.S. PATENT DOCUMENTS

| 6,605,990 | B2 * | 8/2003 | Vermeeren ........................ 330/9 |
| 7,233,365 | B2 * | 6/2007 | Stutz .............................. 348/572 |
| 8,174,416 | B2 * | 5/2012 | Sebastiano et al. ........... 341/118 |
| 2009/0033421 | A1 * | 2/2009 | Fitting et al. .................. 330/259 |
| 2010/0273439 | A1 * | 10/2010 | Kawai ........................... 455/113 |

FOREIGN PATENT DOCUMENTS

JP 2000-295102 A 10/2000

\* cited by examiner

*Primary Examiner* — Jean B Jeanglaude
(74) *Attorney, Agent, or Firm* — Holtz, Holtz, Goodman & Chick, P.C.

(57) ABSTRACT

There is provided with an A/D conversion apparatus which the first terminal receives a reference voltage signal, the single-ended to differential converter conducts single-ended to differential conversion on the reference voltage signal to obtain a first differential signal, the A/D converter conducts A/D conversion on the first differential signal based on the reference voltage signal to obtain a first digital signal, the digital circuit detects a DC offset which is a difference between the first digital signal and a digital signal, the second terminal receives an input signal, the single-ended to differential converter conducts single-ended to differential conversion on the input signal to acquire a second differential signal, the A/D converter conducts A/D conversion on the second differential signal based on the reference voltage signal to acquire a second digital signal, and the digital circuit subtracts the DC offset from the second digital signal to obtain a third digital signal.

5 Claims, 4 Drawing Sheets

A/D CONVERSION APPARATUS AND DC-DC CONVERSION APPARATUS

CROSS REFERENCE TO RELATED APPLICATIONS

This application is based upon and claims the benefit of priority from the prior Japanese Patent Application No. 2011-185216, filed on Aug. 26, 2011, the entire contents of which are incorporated herein by reference.

FIELD

The present embodiment relates to an A/D conversion apparatus and a DC-DC conversion apparatus having the A/D conversion apparatus mounted thereon, and, for example, relates to, an A/D conversion apparatus which conducts A/D conversion by converting a single-ended signal such as an output DC voltage of a digital power supply IC to a differential signal.

BACKGROUND

DC offset cancel in a conventional A/D converter is conducted by inputting two analog signals serving as references, detecting a DC offset error and a gain error of A/D conversion, and canceling the errors in digital processing in a subsequent stage.

However, the above-described conventional technique has a problem that two different reference analog signals are needed. Furthermore, precisions are required of the two different reference analog signals. In addition, there is a problem of an error of the A/D converter involving single-ended to differential conversion, when conducting single-ended to differential conversion on an input signal.

DETAILED DESCRIPTION

According to an embodiment, there is provided with an A/D conversion apparatus including: a first terminal, a single-ended to differential converter, an A/D converter, a digital circuit, and a second terminal.

The first terminal receives a reference voltage signal.

The single-ended to differential converter conducts single-ended to differential conversion on the reference voltage signal to obtain a first differential signal.

The A/D converter conducts A/D conversion on the first differential signal on the basis of the reference voltage signal to obtain a first digital signal.

The digital circuit detects a DC offset which is a difference between the first digital signal and a digital signal representing a predetermined code.

The second terminal receives an input signal.

The single-ended to differential converter conducts single-ended to differential conversion on the input signal to acquire a second differential signal.

The A/D converter conducts A/D conversion on the second differential signal on the basis of the reference voltage signal to acquire a second digital signal.

The digital circuit subtracts the DC offset from the second digital signal to obtain a third digital signal and outputs the third digital signal.

Hereafter, embodiments of the present invention will be described in detail with reference to the drawings.

Figure 1:
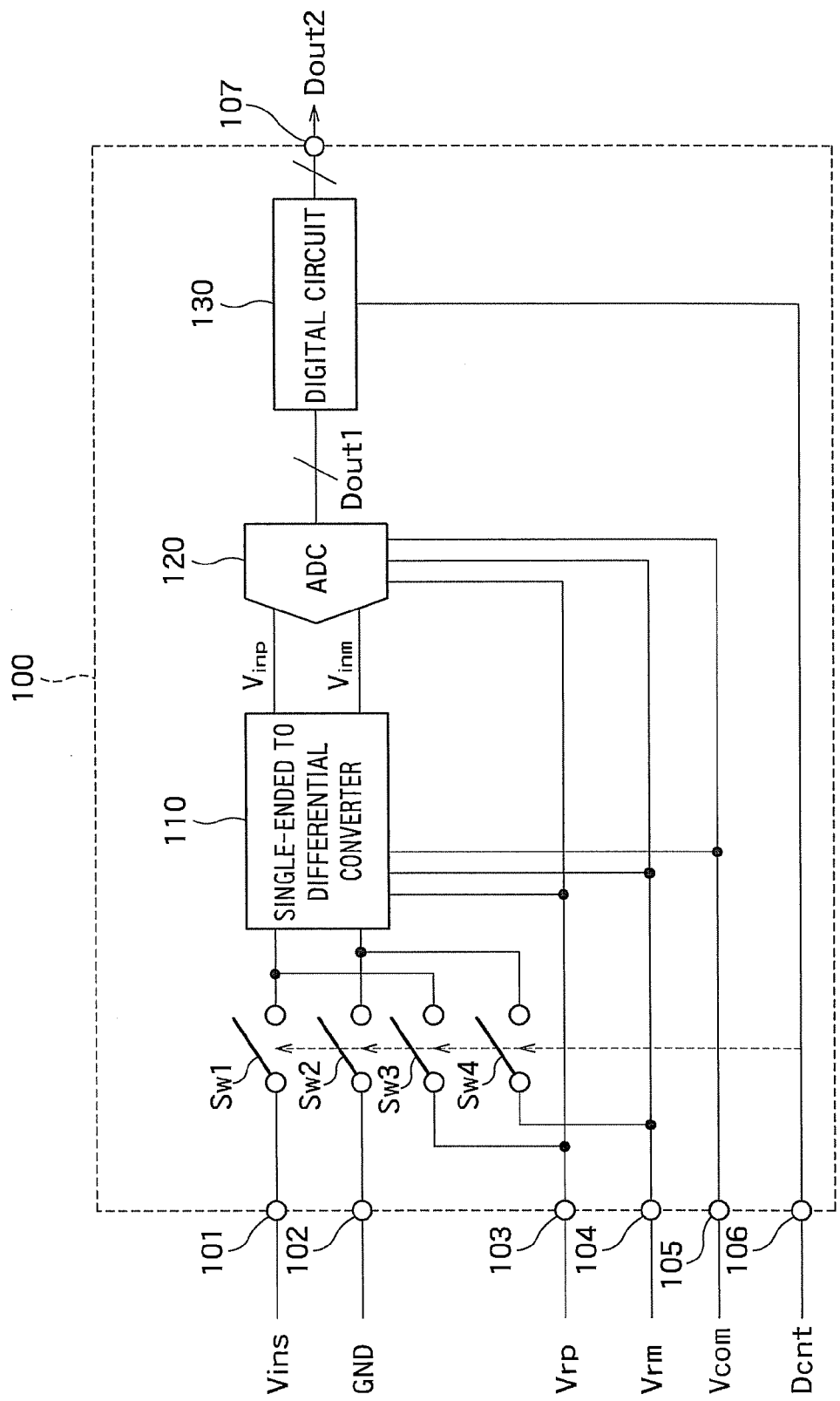
FIG. 1 is a block diagram showing a configuration of an A/D conversion apparatus according to a first embodiment.

FIG. 1 shows a configuration of an A/D conversion apparatus according to a first embodiment.

An A/D conversion apparatus 100 includes a single-ended to differential converter 110, an A/D converter (ADC) 120, a digital circuit 130, switches Sw1, Sw2, Sw3 and Sw4, and terminals 101, 102, 103, 104, 105, 106 and 107. The terminals 103 to 105 correspond to first terminals. The terminals 101 and 102 correspond to second terminals.

A single-ended voltage signal (input signal) Vins which is an analog signal is received at the terminal 101, and input to the single-ended to differential converter 110 via the switch Sw1.

A ground signal (input signal) GND is received at the terminal 102, and input to the single-ended to differential converter 110 via the switch Sw2.

A plus-side reference voltage signal (reference signal) Vrp is received at the terminal 103. The signal Vrp is input to the ADC 120 and input to the single-ended to differential converter 110 via the switch Sw3.

A minus-side reference voltage signal (reference signal) Vrm is received at the terminal 104. The signal Vrm is input to the ADC 120 and input to the single-ended to differential converter 110 via the switch Sw4.

A reference voltage signal Vcom is received at the terminal 105 and input to the single-ended to differential converter 110 and the ADC 120.

The reference voltage signals Vrp, Vrm and Vcom are supplied from an external reference voltage source (see FIG. 4 which will be described later).

A mode signal Dcnt which is a digital signal is received at the terminal 106 and input to the digital circuit 130. The mode signal Dcnt is supplied to the switches Sw1, Sw2, Sw3 and Sw4 as their respective control signals. The mode signal Dcnt sets an operation mode of the A/D conversion apparatus.

As operation modes, there are an offset detection mode and an offset cancel mode. In the offset detection mode, a DC offset in the A/D conversion apparatus is detected before an ordinary operation. In the offset cancel mode, A/D conversion with the DC offset canceled is conducted at the time of the ordinary operation.

In the offset detection mode, the switches Sw1 and Sw2 are turned off and the switches Sw3 and Sw4 are turned on. As a result, the signals Vrp and Vrm are input to the single-ended to differential converter 110.

In the offset cancel mode, the switches Sw1 and Sw2 are turned on and the switches Sw3 and Sw4 are turned off. As a result, the signals Vins and GND are input to the single-ended to differential converter 110.

Note that, the mode signal Dcnt is input directly to the switches. Alternatively, a control circuit which generates control signals respectively for the switches on the basis of the mode signal and outputs the control signals respectively to the switches may be provided.

The single-ended to differential converter 110 converts a difference between two input signals to a differential signal by using the reference voltage signals Vrp, Vrm and Vcom as references, and outputs the differential signal.

Denoting the difference between the two signals by V1, conversion of the signal V1 (single-ended signal) to a differential signal being a pair of Vinp and Vinm is represented by the following Equation (1) and Equation (2). Vcom is a middle value between Vrp and Vrm as indicated by Equation (3).

$$v_{inp} = \frac{v_1 - (v_{rp} - v_{rm})}{2} + v_{com} \quad \text{Equation (1)}$$

$$v_{inm} = \frac{-v_1 + (v_{rp} - v_{rm})}{2} + v_{com} \quad \text{Equation (2)}$$

$$v_{com} = \frac{1}{2}(v_{rp} + v_{rm}) \quad \text{Equation (3)}$$

The differential signal of Vinp and Vinm is output from the single-ended to differential converter 110 and input to the ADC 120.

The ADC 120 conducts A/D conversion on the differential signal of Vinp and Vinm which are input, in a voltage range depending upon the reference voltage signals. The ADC 120 outputs a digital signal Dout1 which is obtained as a result of the A/D conversion. The digital signal Dout1 is input to the digital circuit 130.

The digital circuit 130 conducts predetermined digital processing on the digital signal Dout1, and outputs a digital signal Dout2 which is a processing result. Operation of the digital circuit 130 differs depending upon the mode signal Dcnt. In the offset detection mode, an offset quantity is detected by using a method which will be described later and stored as a digital value Dofs. In the offset cancel mode, DC offset cancel is conducted by subtracting the digital value Dofs which indicates the detected offset quantity from the digital signal Dout1 which is output from the ADC 120. The digital circuit 130 outputs a result of the offset cancel (A/D conversion result) as the digital signal Dout2.

A method for detecting the DC offset in the A/D conversion apparatus 100 will now be described.

In the A/D conversion apparatus 100, a DC offset is caused in the single-ended to differential converter 110 and the ADC 120 due to element variations and the like in analog circuits. An analog voltage of the DC offset to the input (equivalent input voltage) is denoted by Vofs.

If the single-ended voltage signal Vins is subjected to A/D conversion as it is, in the A/D conversion apparatus 100 which contains the equivalent input voltage Vofs, then the digital signal Dout1 becomes a signal obtained by adding Dofs to a digital value obtained when there is no DC offset (i.e., a digital value obtained when there is no DC offset+Dofs). Therefore, an A/D conversion error depending upon Dofs is generated.

For detecting the DC offset Dofs, the reference voltage signals Vrp and Vrm are used as the voltage signals which are input to the single-ended to differential converter 110.

The reference voltage signal Vrp is input to the single-ended to differential converter 110 via the switch Sw3, and the reference voltage signal Vrm is input to the single-ended to differential converter 110 via the switch Sw4. Note that, at this time, the mode signal Dcnt indicating the offset detection mode is input to the terminal 106, the switches Sw3 and Sw4 are turned on whereas the switches Sw1 and Sw2 are turned off.

If there is no DC offset Dofs, then a difference between the reference voltage signals Vrp and Vrm is processed as a single-ended signal and the output signal (differential signal of Vinp and Vinm) of the single-ended to differential converter 110 are indicated by Equation (4) and Equation (5).

$$v_{inp} = \frac{v_1 - (v_{rp} - v_{rm})}{2} + v_{com} \quad \text{Equation (4)}$$
$$= \frac{(v_{rp} - v_{rm}) - (v_{rp} - v_{rm})}{2} + v_{com}$$
$$= v_{com}$$

$$v_{inm} = \frac{-v_1 + (v_{rp} - v_{rm})}{2} + v_{com} \quad \text{Equation (5)}$$
$$= \frac{-(v_{rp} - v_{rm}) + (v_{rp} - v_{rm})}{2} + v_{com}$$
$$= v_{com}$$

When values of each signal forming the differential signal which are input are equal to each other and equal to Vcom, the ADC 120 always outputs a middle code. The middle code is a code which is 1 only in the highest order bit and 0 in other bits. (In the case of a 5-bit signal, the middle code is 10000). Here, the middle code is described as Dcen.

When the reference voltage signals Vrp and Vrm are input to the single-ended to differential converter 110, therefore, it follows that Vinp=Vinm=Vcom and consequently the digital output value of the ADC 120 becomes the middle code Dcen.

If the DC offset Dofs exists, then the DC offset Vofs is added to the input and consequently the differential signal of Vinp and Vinm are indicated by Equation (6) and Equation (7).

$$v_{inp} = \frac{v_{ins} - (v_{rp} - v_{rm})}{2} + v_{com} \quad \text{Equation (6)}$$
$$= \frac{(v_{rp} - v_{rm} + v_{ofs}) - (v_{rp} - v_{rm})}{2} + v_{com}$$
$$= v_{com} + \frac{1}{2} v_{ofs}$$

$$v_{inm} = \frac{-v_{ins} + (v_{rp} - v_{rm})}{2} + v_{com} \quad \text{Equation (7)}$$
$$= \frac{-(v_{rp} - v_{rm} + v_{ofs}) + (v_{rp} - v_{rm})}{2} + v_{com}$$
$$= v_{com} - \frac{1}{2} v_{ofs}$$

Therefore, the DC offset Dofs which is the equivalent input voltage Vofs (error) is added. As a result, the digital output obtained by the A/D conversion in the ADC 120 becomes the middle code Dcen+DC offset Dofs. Accordingly, the DC offset Dofs can be detected by subtracting the middle code Dcen from the digital output.

For example, if "10011" is output as the output Dout1 of the ADC 120, then the DC offset Dofs becomes "00011" because 10011−10000=00011. If "01101" is output as the output Dout1 of the ADC 120, then the DC offset Dofs becomes "11101" because 01101−10000=11101. The digital circuit 130 stores the detected DC offset Dofs (digital value) therein.

At the time of the ordinary operation, the mode signal Dcnt which indicates the offset cancel mode is input. As a result, the switches Sw1 and Sw2 are turned on whereas the switches Sw3 and Sw4 are turned off, and the digital circuit 130 conducts the offset cancel operation. Since the switches Sw1 and Sw2 are turned on, Vins and GND are input to the single-ended to differential converter 110 and the differential signal is obtained. The differential signal is subject to the A/D conversion in the ADC 120, and Dout1 is output. The digital circuit 130 subtracts the DC offset Dofs from Dout1, and thereby obtains the digital signal Dout2 with the DC offset canceled. The digital circuit 130 outputs the digital signal Dout2 from the terminal 107.

An example of detection of the DC offset will now be described by using a concrete example.

A 6-bit ADC is supposed as an example. It is supposed that Vins has a full scale of 1 V, and Vrp=0.75 V, Vrm=0.25 V and Vcom=0.5 V. Furthermore, it is supposed that Vofs=0.07 V. Since the full scale of the input to the ADC is 1 V, a voltage of the LSB in the 6 bits is V1sb=0.03125 V.

At this time, the DC offset is detected as described hereafter.

At the time of the offset detection, an offset detection mode signal is received at the terminal 106 as the mode signal Dcnt and the switches Sw1 and Sw2 are turned off whereas the switches Sw3 and Sw4 are turned on. Vrp and Vrm are input to the single-ended to differential converter 110. The DC offset of 0.07 V is added to the single-ended input of 0.5 V, and consequently the input containing the DC offset becomes 0.57 V. This is subject to the single-ended to differential conversion, and resultant differential signal (first differential signal) become Vinp=0.535 V and Vinm=0.465 V. An A/D conversion result (a first digital signal) of the differential signal becomes Dout1=10010. The digital circuit 130 subtracts the middle code Vcen=10000 from Dout1=10010 and detects Dofs=00010 as the DC offset (offset). The digital circuit 130 stores the detected DC offset therein.

At the time of the ordinary operation, an offset cancel mode signal is received at the terminal 106 as the mode signal Dcnt and the switches Sw1 and Sw2 are turned on whereas the switches Sw3 and Sw4 are turned off. Then, Vins and GND are input to the single-ended to differential converter 110. The single-ended to differential converter 110 converts a single-ended signal obtained by Vins and GND to a differential signal (second differential signal). The ADC 120 conducts A/D conversion on the differential signal. The digital circuit 103 subtracts the offset value stored therein from the result of the A/D conversion Dout1 (a second digital signal). As a result, the output value Dout2 (a third digital signal) with the DC offset Vofs canceled is obtained. The output value Dout2 is output from the terminal 107.

Figure 2:
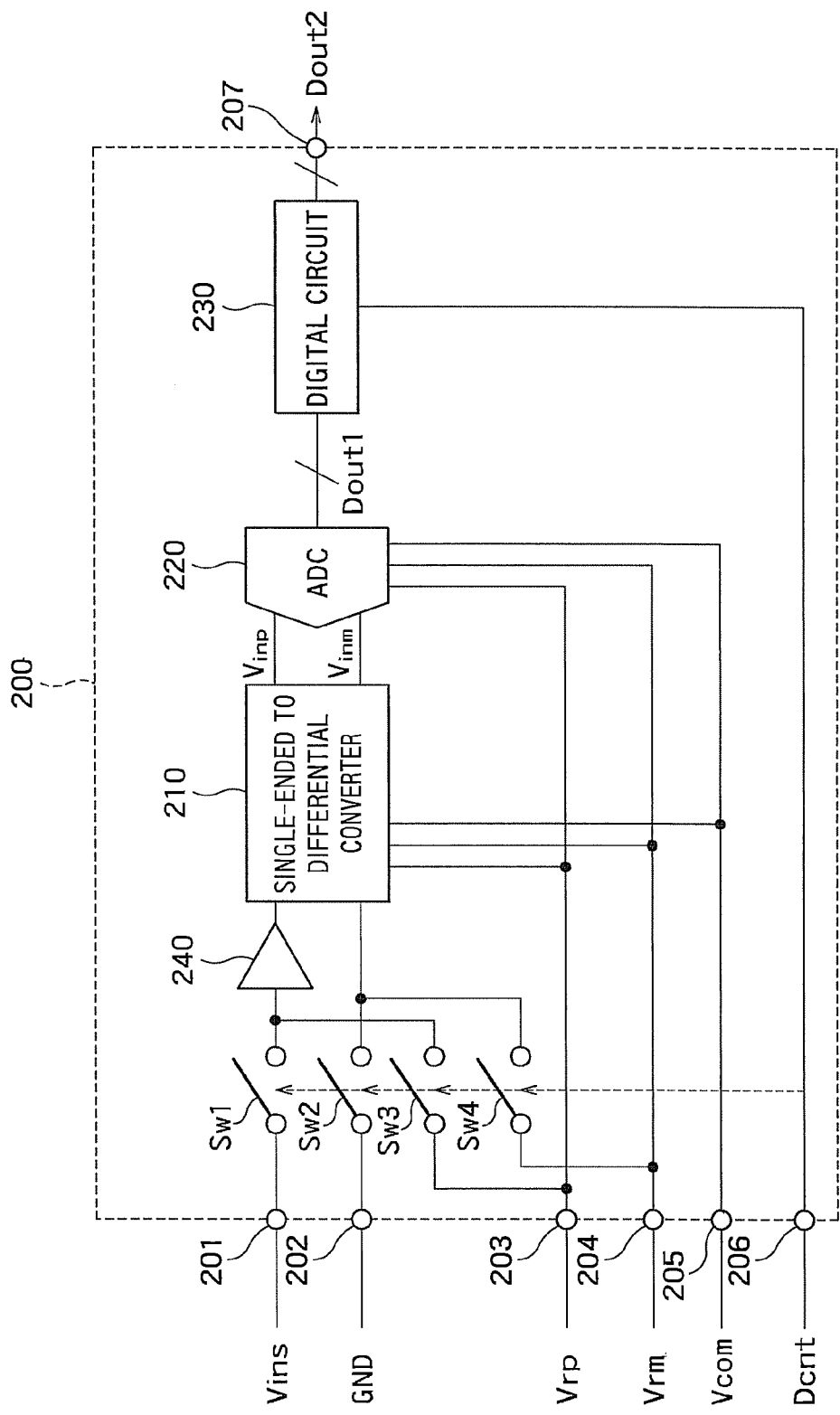
FIG. 2 is a block diagram showing a configuration of an A/D conversion apparatus according to a second embodiment.

FIG. 2 shows a configuration of an A/D conversion apparatus according to a second embodiment.

A buffer amplifier 240 is disposed between the switch Sw1 and the single-ended to differential converter 210. The configuration shown in FIG. 2 is a configuration for conducting impedance conversion on a single-ended signal which is an analog signal, conducting sampling, and then conducting A/D conversion. The buffer amplifier 240 is a buffer which drives a capacitance in the single-ended to differential converter 210.

Terminals 201, 202, 203, 204, 205, 206 and 207 have the same configurations as those of the terminals 101, 102, 103, 104, 105, 106 and 107 shown in FIG. 1. A single-ended to differential converter 210, an ADC 220, and a digital circuit 230 have the same configurations as those of the single-ended to differential converter 110, the ADC 120, and the digital circuit 130 shown in FIG. 1.

In the case of the configuration in which the buffer amplifier is disposed on a line of an input single-ended as shown in FIG. 2, the buffer amplifier itself has a DC offset. The input voltage becomes equivalent to a value containing the DC offset as well. In this configuration, therefore, the DC offset Dofs containing the DC offset of the buffer amplifier 240 as well can be detected.

Operations other than the operation described above are the same as those in the first embodiment. Therefore, duplicated description will not be repeated.

Figure 3:
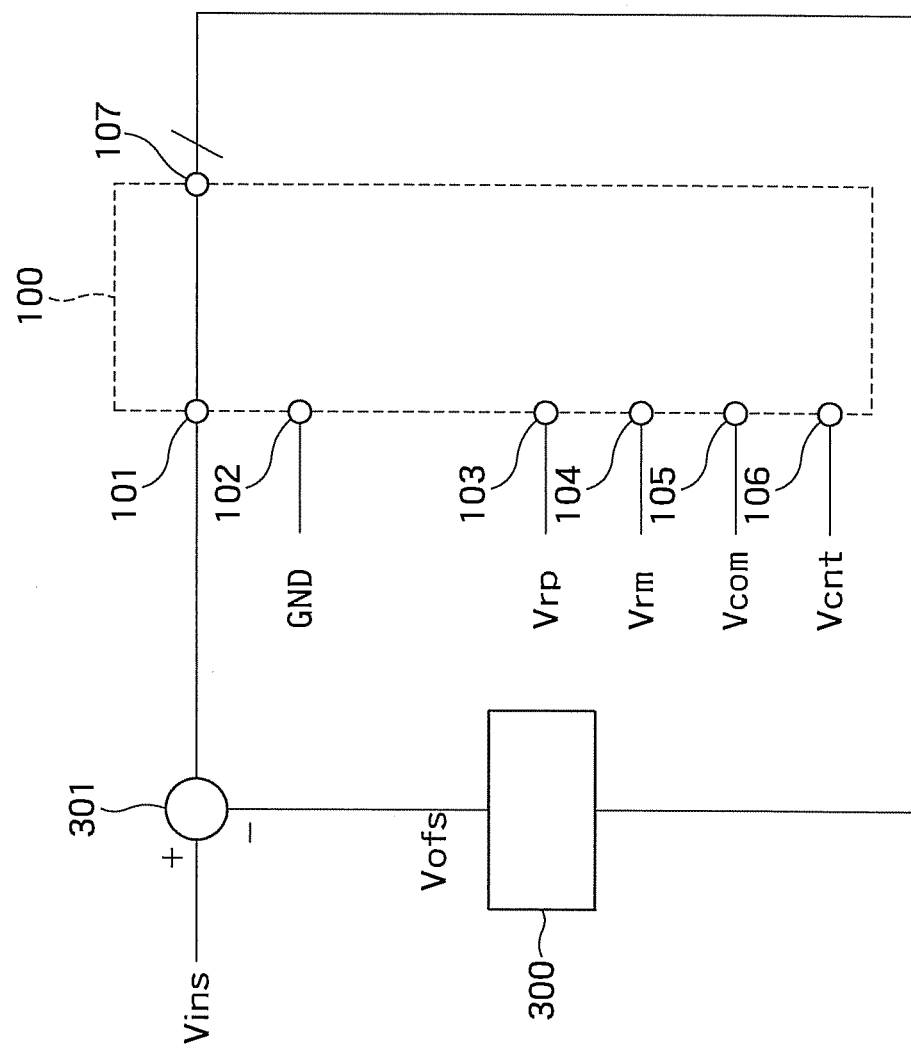
FIG. 3 is a block diagram showing a configuration of an A/D conversion apparatus according to a third embodiment.

FIG. 3 shows a configuration which converts the detected DC offset value to an analog value, and cancels the analog offset value from the input signal, as a third embodiment.

The digital value Dofs which indicates the offset voltage of the ADC 120 is output from the A/D conversion apparatus 100 and input to a converter 300. Note that, at this time, the offset detection mode signal is being input to the A/D conversion apparatus 100. The converter 300 conducts DA conversion on the digital value Dofs, and outputs the corresponding analog voltage Vofs (analog offset).

At the time of the ordinary operation, a subtraction circuit 301 subtracts the analog voltage Vofs from Vins and inputs a voltage of Vins−Vofs to the A/D conversion apparatus 100. Since Vins−Vofs is a voltage obtained by subtracting the offset voltage from Vins, the offset can be previously canceled.

In other words, within the ADC 120, the offset voltage Vofs is added to the input voltage (Vins−Vofs) from the terminal 101. As a result, a code Dout corresponding to (Vins−Vofs)+Vofs=Vins is output from the ADC 120. The digital circuit 130 outputs the code Dout as it is. Or the digital circuit 130 conducts arbitrary digital processing on the code Dout and outputs a result. Note that, at this time, the offset cancel mode signal is being input to the A/D conversion apparatus 100.

In the present embodiment, a differential signal obtained by converting the voltage after the subtraction, in the single-ended to differential converter 110 corresponds to a third differential signal. Furthermore, a digital signal obtained by conducting A/D conversion on the third differential signal in the ADC 120 corresponds to a fourth digital signal.

It becomes unnecessary to subtract the offset voltage in a digital domain by subtracting the offset voltage in the analog domain in this way. Therefore, the offset cancel becomes possible without reducing the digital output code width by a value corresponding to the offset voltage.

Figure 4:
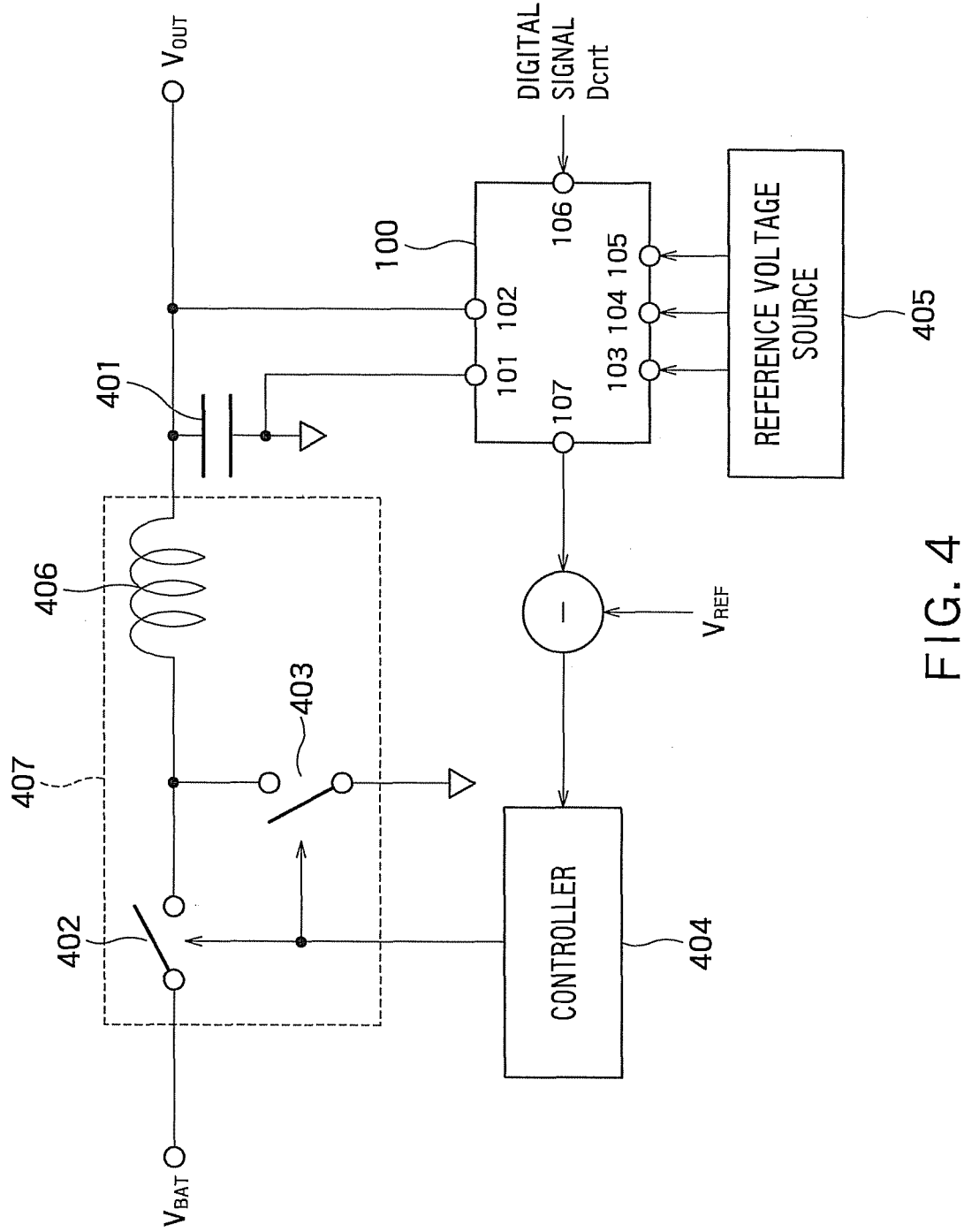
FIG. 4 is a block diagram showing a configuration of a DC-DC conversion apparatus having an A/D conversion apparatus according to one of the first to third embodiments mounted thereon.

FIG. 4 shows a configuration of a DC-DC converter involving digital control, according to a fourth embodiment.

The DC-DC converter steps down an input voltage $V_{BAT}$ to a desired voltage $V_{REF}$ and outputs an output voltage Vout. Vout is a single-ended signal, and a difference between GND which is located directly under a capacitor 401 and Vout is an output of the DC-DC converter. The output of the DC-DC converter is a single-ended signal around GND. The DC-DC converter includes the A/D conversion apparatus 100 according to the first embodiment shown in FIG. 1. The DC-DC converter may include the A/D conversion apparatus according to the second embodiment shown in FIG. 2 or the A/D conversion apparatus according to the third embodiment shown in FIG. 3.

The single-ended signal obtained by the output voltage Vout and GND is converted to a digital signal by the A/D conversion apparatus 100 and fed back from the terminal 107. If the A/D conversion apparatus according to the first or second embodiment is used, the digital signal fed back corresponds to the third digital signal. If the A/D conversion apparatus according to the third embodiment is used, the digital signal fed back corresponds to the fourth digital signal.

A controller 404 controls on/off of a high-side switch 402 and a low-side switch 403 on the basis of a difference between the digital signal fed back and the desired voltage $V_{REF}$. As a result, the input voltage $V_{BAT}$ is stepped down. A reference voltage source 405 generates the reference voltage signals Vrp, Vrm and Vcom and supplies them to the terminals 103, 104 and 105 of the A/D conversion apparatus 100. The terminal 106 receives the mode signal which is a digital signal from the external. The high-side switch 402, the low-side switch 403, and a coil 406 constitute a power stage 407 which steps down the input voltage to the output voltage.

A large current flows to GND in the DC-DC converter with a time change. Therefore, it is necessary to convert the single-ended signal to a differential signal by using a single-ended to differential converter in order to prevent influence of noise. Furthermore, since the output value Dout+Doft containing the DC offset value error of the ADC becomes the value of Vout, it is necessary to remove Doft. Therefore, the DC offset is detected and canceled by using a method which is similar to that in the first embodiment.

In addition, when conducting single-ended to differential conversion in the case where, for example, resistive voltage division is conducted on Vout, a buffer amplifier for conducting impedance conversion is needed in some cases. Since the GND signal is very low in impedance, the buffer amplifier is not needed. Offset cancel at that time also becomes possible by using a method which is similar to that in the second embodiment.

In the present embodiment, the case where the input voltage is stepped down has been shown. However, a configuration which steps up the input voltage is also possible.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. An A/D conversion apparatus comprising:
a first terminal to receive a reference voltage signal;
a single-ended to differential converter configured to conduct single-ended to differential conversion on the reference voltage signal to obtain a first differential signal;
an A/D converter configured to conduct A/D conversion on the first differential signal on the basis of the reference voltage signal to obtain a first digital signal;
a digital circuit configured to detect a DC offset which is a difference between the first digital signal and a digital signal representing a predetermined code; and
a second terminal to receive an input signal,
wherein
the single-ended to differential converter conducts single-ended to differential conversion on the input signal to acquire a second differential signal,
the A/D converter conducts A/D conversion on the second differential signal on the basis of the reference voltage signal to acquire a second digital signal, and
the digital circuit subtracts the DC offset from the second digital signal to obtain a third digital signal and output the third digital signal.

2. The apparatus according to claim 1, further comprising an amplifier to conduct impedance conversion on the reference voltage signal and the input signal, respectively,
wherein the single-ended to differential converter conducts single-ended to differential conversion on the reference voltage signal subjected to the impedance conversion and conducts single-ended to differential conversion on the input signal subjected to the impedance conversion, respectively.

3. An A/D conversion apparatus comprising:
a first terminal to receive a reference voltage signal;
a single-ended to differential converter configured to conduct single-ended to differential conversion on the reference voltage signal to obtain a first differential signal;
an A/D converter configured to conduct A/D conversion on the first differential signal on the basis of the reference voltage signal to obtain a first digital signal;
a digital circuit configured to detect a DC offset which is a difference between the first digital signal and a digital signal representing a predetermined code;
a second terminal to receive an input signal;
a converter configured to conduct DA conversion on the DC offset; and
a subtraction circuit configured to subtract the DC offset subjected to the DA conversion from the input signal,
wherein
the single-ended to differential converter conducts single-ended to differential conversion on the input signal after the DC offset is subtracted to acquire a third differential signal,
the A/D converter conducts A/D conversion on the third differential signal on the basis of the reference voltage signal to acquire a fourth digital signal, and
the digital circuit outputs the fourth digital signal.

4. A DC-DC conversion apparatus which converts an input voltage to an output voltage which is different from the input voltage, comprising:
a power stage including a high-side switch and a low-side switch, the power stage alternately switching over the high-side switch and the low-side switch to turn on or off;
an A/D conversion apparatus according to claim 1, which receives a signal indicating the output voltage as the input signal and conducts differential conversion and A/D conversion to acquire the third digital signal; and
a controller configured to control the high-side switch and the low-side switch on the basis of the third digital signal.

5. A DC-DC conversion apparatus which converts an input voltage to an output voltage which is different from the input voltage, comprising:
a power stage including a high-side switch and a low-side switch, the power stage alternately switching over the high-side switch and the low-side switch to turn on or off;
an A/D conversion apparatus according to claim 3, which receives a signal indicating the output voltage as the input signal and conducts differential conversion and A/D conversion to acquire the fourth digital signal; and
a controller configured to control the high-side switch and the low-side switch on the basis of the fourth digital signal.

* * * * *